United States Patent
Xiang

(10) Patent No.: US 6,514,809 B1
(45) Date of Patent: Feb. 4, 2003

(54) SOI FIELD EFFECT TRANSISTORS WITH BODY CONTACTS FORMED BY SELECTIVE ETCH AND FILL

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/706,497

(22) Filed: Nov. 3, 2000

(51) Int. Cl.[7] .............................................. H01L 21/00
(52) U.S. Cl. ...................................... 438/214; 438/222
(58) Field of Search ................... 438/214, 183, 438/222, 149, 151, 142, 174, 184, 197, 280, 164, 218, 479, 517, 303, 311; 257/57, 347

(56) References Cited

U.S. PATENT DOCUMENTS

| | | |
|---|---|---|
| 4,571,609 A | 2/1986 | Hatano |
| 4,670,090 A * | 6/1987 | Sheng et al. ............... 438/183 |
| 4,683,637 A | 8/1987 | Varker et al. |
| 5,264,382 A * | 11/1993 | Watanabe .................. 438/183 |
| 5,391,503 A | 2/1995 | Miwa et al. |
| 5,466,630 A | 11/1995 | Lur |
| 5,620,912 A | 4/1997 | Hwang et al. |
| 5,674,760 A | 10/1997 | Hong |
| 5,877,046 A | 3/1999 | Yu et al. |
| 5,894,152 A * | 4/1999 | Jaso et al. .................. 257/347 |
| 5,963,789 A | 10/1999 | Tsuchiaki |
| 5,965,917 A * | 10/1999 | Maszara ..................... 257/347 |
| 5,972,758 A | 10/1999 | Liang |
| 6,156,589 A * | 12/2000 | Noble ........................ 438/149 |
| 6,229,187 B1 * | 5/2001 | Ju ................................ 257/396 |
| 6,313,507 B1 * | 11/2001 | Lee .............................. 257/347 |

* cited by examiner

Primary Examiner—Stephen D. Meier
(74) Attorney, Agent, or Firm—Renner, Otto, Boisselle & Sklar, LLP

(57) ABSTRACT

A field effect transistor on an SOI wafer has a non-floating body which is tied to the substrate of the wafer by a bridge of conductive material such as semiconductor material. The bridge is created by selectively etching through a portion of a surface semiconductor layer and the underlying portion of a buried insulator layer, thereby making an opening or trench which exposing some of the semiconductor substrate of the SOI wafer. Then the opening is filled, for example by growth of a replacement semiconductor material by selective epitaxy.

6 Claims, 5 Drawing Sheets

SOI FIELD EFFECT TRANSISTORS WITH BODY CONTACTS FORMED BY SELECTIVE ETCH AND FILL

CROSS REFERENCE TO RELATED APPLICATIONS

This application is related to the following commonly assigned, copending applications: U.S. application Ser. No. 09/420,972, filed Oct. 20, 1999; U.S. application Ser. No. 09/421,305, filed Oct. 20, 1999; U.S. application Ser. No. 09/421,639, filed Oct. 20, 1999; and U.S. application Ser. No. 09/633,960, filed Aug. 8, 2000. The entire disclosures of all of the above applications are incorporated herein by reference.

BACKGROUND OF THE INVENTION

1. Technical Field

The present invention relates generally to semiconductor-on-insulator (SOI) structures, and more specifically to partially-isolated SOI structures.

2. Description of the Related Art

Conventional or bulk semiconductor devices are formed in semiconductor material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, semiconductor-on-insulator technology (SOI) has been gaining popularity. A SOI wafer may be formed from a bulk silicon wafer by using conventional oxygen implantation techniques to create a buried oxide layer at a predetermined depth below the surface. The implanted oxygen oxidizes the silicon into insulating silicon dioxide in a gaussian distribution pattern centered at the predetermined depth to form the buried oxide layer. Field effect transistors formed on SOI substrates also may be able to achieve higher speed operation with higher drive currents, when compared with FETs formed on conventional bulk silicon substrates.

However, one problem with forming field effect transistors on an SOI wafer is the floating body effect. The floating body effect occurs because the buried oxide layer isolates the channel, or body, of the transistor from the fixed potential silicon substrate and therefore the body takes on charge based on recent operation of the transistor. The floating body effect causes the current-to-voltage curve for the transistor to distort or kink, which in turn causes the threshold voltage for operating the transistor to fluctuate. This problem is particularly apparent for passgate devices such as those used in dynamic random access memory (DRAM) wherein it is critical that the threshold voltage remain fixed such that the transistor remains in the "off" position to prevent charge leakage from the storage capacitor.

Another problem associated with SOI technology is heat build up. The insulating silicon dioxide in the buried oxide layer is a poor heat conductor and prevents effective heat dissipation into bulk silicon below the buried oxide layer.

Accordingly, there is a strong need in the art for a semiconductor circuit structure, and a method for forming such structure, that includes the low junction capacitance and low "off" state leakage characteristics of the SOI FET based circuits but does not suffer the disadvantages of a floating body potential and heat build up.

SUMMARY OF THE INVENTION

A field effect transistor on an SOI wafer has a non-floating body which is tied to the substrate of the wafer by a bridge of conductive material such as semiconductor material. The bridge is created by selectively etching through a portion of a surface semiconductor layer and the underlying portion of a buried insulator layer, thereby making an opening or trench which exposing some of the semiconductor substrate of the SOI wafer. Then the opening is filled, for example by growth of a replacement semiconductor material by selective epitaxy.

According to an aspect of the invention, a method of forming a semiconductor device includes the steps of exposing a portion of a semiconductor substrate of a semiconductor-on-insulator wafer by removing overlying portions of a surface semiconductor layer and of a buried insulator layer between the substrate and the surface semiconductor layer, thereby forming an opening perforating the surface semiconductor layer and the buried insulator layer; and filling the opening with conductive material to thereby electrically connect the substrate and the surface layer.

According to another aspect of the invention, a method of forming a semiconductor device includes the steps of forming a dummy gate on an active region of a surface semiconductor layer which is separated from a semiconductor substrate by an intervening buried insulator layer; selectively doping portions of the active region to form a source and a drain on opposite sides of a body, using the dummy gate as a doping mask; removing the dummy gate; exposing a portion of a semiconductor substrate of a semiconductor-on-insulator wafer by removing overlying portions of the active layer and of the buried insulator layer, thereby forming an opening perforating the surface semiconductor layer and the buried insulator layer, wherein the exposing includes etching the active region and the insulating layer through a space left by removal of the dummy gate; and epitaxially growing a semiconductor material to fill the opening and thereby electrically connect the substrate and the body.

According to yet another aspect of the invention, a semiconductor device includes an active semiconductor region including a source and a drain with a body therebetween; a gate atop the active region and operatively coupled to the source, the body and the drain; a buried insulator layer between the active region and an underlying semiconductor substrate, wherein the buried insulator layer has a perforation therein a semiconductor bridge in the perforation, the bridge in contact with the body and the substrate, and electrically connecting the body and the substrate wherein the bridge and at least part of the body include epitaxially-grown semiconductor material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A semiconductor device includes a transistor on an SOI substrate, the transistor having a non-floating body tied to an underlying semiconductor substrate by means of a bridge of semiconductor material through a perforation in a buried insulator layer between the substrate and an active surface semiconductor region of the transistor. The bridge is in contact with the body and the substrate on opposite sides of the perforation, and electrically connects the body to the substrate, thereby reducing or eliminating floating body effects in the body. The body tie is formed by etching a trench or other opening down through the body portion of the active region, and through the buried insulating layer to the substrate, thereby creating the perforation in the insulator layer. Semiconductor material is then used to fill the opening, for example by epitaxial growth. The semiconductor fill material thereby acts as the bridge and at least part of the body. A gate is thereafter formed on top of the active region, for example on top of the semiconductor fill material. This method provides for accurate alignment of the semiconductor bridge and the overlying gate.

Figure 1:
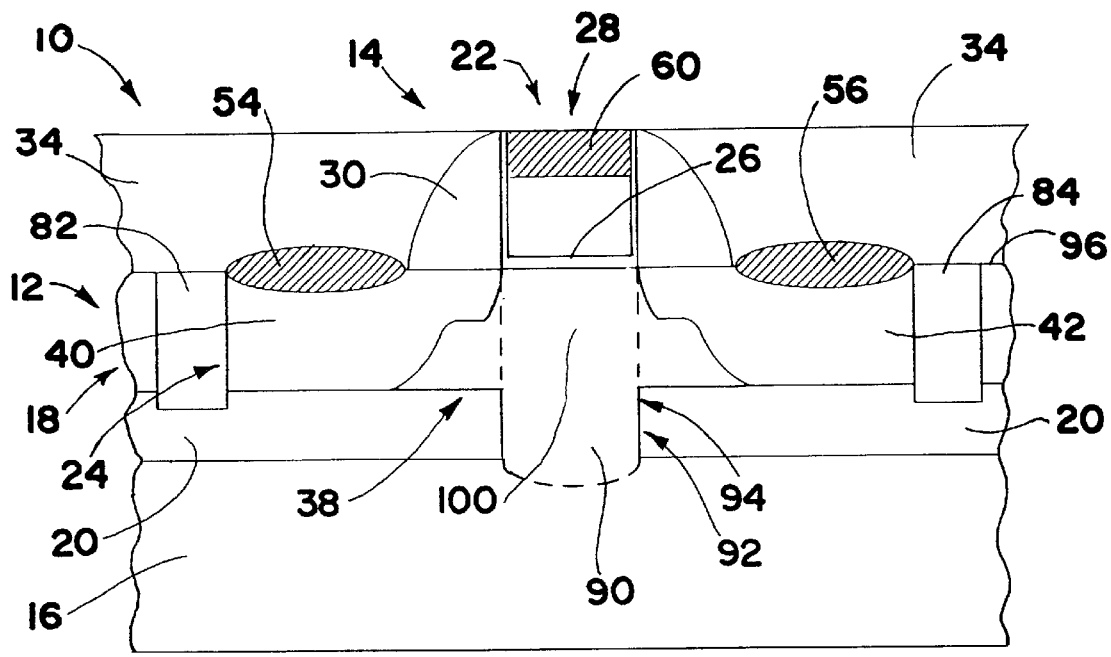
FIG. 1 is a cross-sectional view of a semiconductor device in accordance with the present invention.

Referring initially to FIG. 1, a semiconductor device 10 includes an SOI wafer 12 with a transistor 14 formed thereupon. The SOI wafer 12 includes a semiconductor substrate 16 and a surface semiconductor layer 18, with a buried insulator layer 20 therebetween. As is conventional, the semiconductor substrate 16 and the surface semiconductor layer 18 may be made of silicon and the buried insulator layer 20 may be made of a silicon oxide such as $SiO_2$, although it will be appreciated that other suitable materials may be used instead or in addition.

The transistor 14 includes a gate 22 formed on an active semiconductor region 24 of the surface semiconductor layer 18. The gate 22 includes a gate dielectric 26 and a gate electrode 28. In addition, spacers 30 and 32 are on respective opposite sides of the gate 22. A planarization layer 34 is formed on the SOI wafer 12, further from the gate 22 than the spacers 30 and 32. Exemplary materials for the gate dielectric 26 are $SiO_2$ and $Si_3N_4$. The gate electrode 28 may be made of polysilicon or another semiconductors or may be made in whole or in part of metal. An exemplary material for the spacers 30 and 32 is SiN. The planarization layer 34 may for example be an $SiO_2$ layer.

The active region 24 includes a body 38, with a source 40 and a drain 42 on respective opposite sides of the body. The source 40 and the drain 42 have respective source and drain extensions. As is conventional, the body 38 is of different conductivity semiconductor material than the source 40 and the drain 42. For instance, the non-floating body 38 may be P-conductivity silicon while the source 40 and the drain 42 may be N-conductivity silicon. Alternatively, the non-floating body 38 may be N-conductivity silicon while the source 40 and the drain 42 may be P-conductivity silicon.

The body 38, the source 40, and the drain 42, are operatively coupled with the gate 22 to function as a transistor. The source 40 and the drain 42 have respective source and drain electrically-conducting compound regions 54 and 56 (also referred to as "silicide regions"), to facilitate electrical connection to the source and drain. The gate electrode 28 likewise may includes an upper conductive portion 60 to facilitate electrical connection.

The active region 24 is laterally isolated from other structures of the device 10 by insulator-filled trenches 82 and 84 on opposite sides of the active region. The insulator-filled trenches 82 and 84 may be trenches filled with silicon dioxide ($SiO_2$) using known shallow trench isolation (STI) techniques.

The body 38 is electrically coupled to the substrate 16 by electrically conducting material, such as a semiconductor bridge 90, which passes through a perforation 92 in the buried insulator layer 20. The semiconductor bridge 90 is part of a semiconductor fill material 94 which extends from a wafer surface 96 of the SOI wafer 12, through the active region 24 of the surface semiconductor layer 18, through the perforation 92 of the buried insulator layer 20, to and perhaps into the substrate 16. The semiconductor fill material 94 thus includes a central body portion 100 of the body 38. The semiconductor fill material 94 may include semiconductor material of the same type as that of the substrate 16 (e.g., silicon).

The transistor 14 is thus a partially-isolated transistor, because that the body 38 has an electrical connection (a "tie") to the substrate 16, via the semiconductor bridge 90. Because the semiconductor bridge 90 in the perforation region 92 electrically couples the channel region of the body 38 to the bulk semiconductor substrate 16, the non-floating body channel region potential will remain at the potential of the substrate 16 and does not accumulate a charge, or float, based on historical operation of the transistor 14. The cross-sectional area of the perforation region 92 and the corresponding semiconductor bridge 90 may be smaller than the cross-sectional area of the body 38, and may be significantly smaller than the cross-sectional area of the active region 24. Similarly, the semiconductor bridge 90 may be narrower than the body 38 in a direction from the source 40 to the drain 42; indeed, the semiconductor bridge 90 may be narrower than the body 38 in any corresponding direction. Thus there may be no semiconductor junction, or only a minimally-sized semiconductor junction, between the source 40 and the substrate 16, and between the drain 42 and the substrate. Thus junction capacitance may be reduced. It will be appreciated, however, that the semiconductor bridge 90 may have a larger cross-sectional area than the body 38, may have be wider than the body in one or more corresponding directions, and/or may also be in contact with other parts of the active region 24, if desired.

Figure 2:
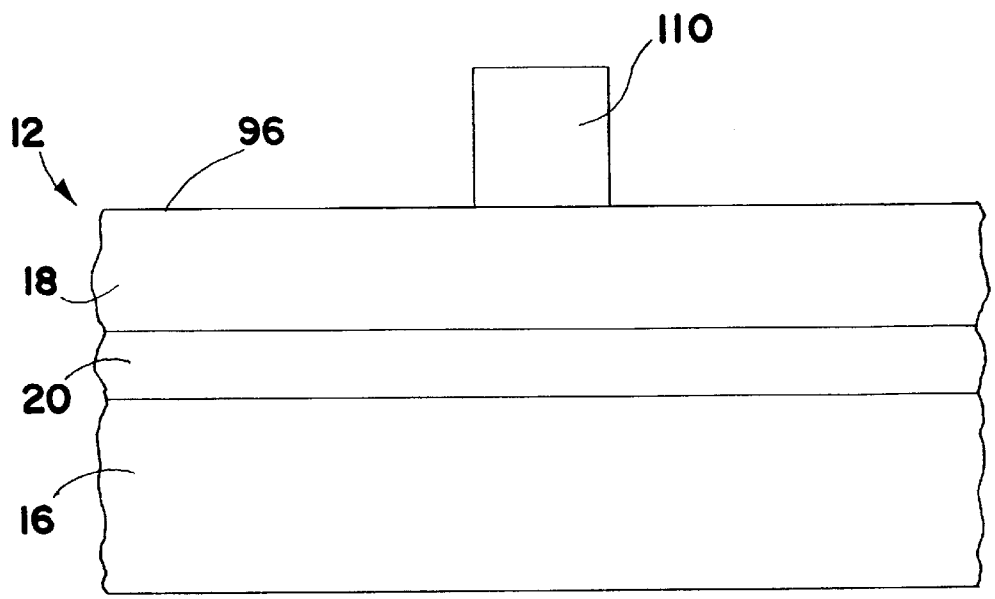
FIGS. 2–10 are cross-sectional views of various steps in a method of fabricating the semiconductor device of FIG. 1.

Various steps in the fabrication of the above-described semiconductor device 10 are illustrated in FIGS. 2–10. Referring initially to FIG. 2, starting initially with the SOI wafer 12, a dummy gate 110 if formed thereupon. It will be appreciated that there are many well-known sources and methods for producing SOI wafers such as the SOI wafer 12. The dummy gate 110 may be made out of a semiconductor material, such as polysilicon, and is formed on the wafer surface 96 of the surface semiconductor layer 18 of the SOI wafer 12. The dummy gate 110 may be formed by an of a variety of well-known processes such as low pressure chemical vapor deposition (LPCVD). The dummy gate 110 is used in formation of the source 40 and the drain 42, as well as in the formation of the silicide regions 54 and 56, as described in greater detail below. Therefore it will be appreciated that the dummy gate 110 may be made out of a wide variety of suitable conductive, semiconductive, or non-conductive materials.

Figure 3:
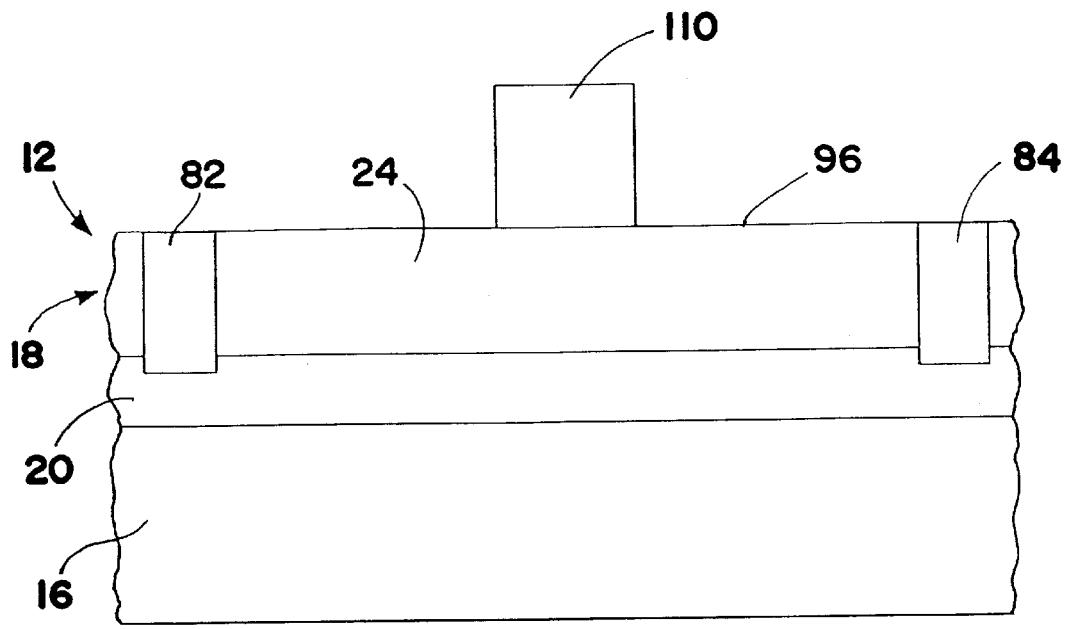

As illustrated in FIG. 3, insulator-filled trenches 82 and 84 are then created in the SOI wafer 12. The insulator-filled trenches 82 and 84 define and laterally isolated the active region 24 of the surface semiconductor layer 18. The insulator-filled trenches may be formed using conventional well-known shallow trench isolation (STI) techniques. An exemplary process for forming an insulating trench 82 and 84 includes forming a thin layer of oxide, approximately 150–200 Angstroms thick, on the wafer surface 96 and a top surface of the dummy gate 110, and forming a silicon nitride mask thereon. The mask covers and protects the substrate in the area where the active region 24 are to be formed while leaving exposed the area where the insulator-filled trenches 82 and 84 are to be formed.

Thereafter, the unmasked portions of the semiconductor surface layer 18 (e.g. the portions where the silicon nitride mask has been etched away) are etched away to form an open trench extending at least past the upper surface of the buried insulator layer 20. The etching process for a silicon substrate is typically an anisotropic dry etch using hydrogen bromide (HBr) which has selectivity characteristics such that it etches the silicon substrate but not the silicon nitride mask.

The open trench is filled by depositing silicon dioxide ($SiO_2$), formed by a chemical reaction involving $SiH_4$ or TEOS, to form insulating trenches 82 and 84. After filling the open trench the surface of the wafer is polished using a chemical mechanical polish to remove any excess silicon dioxide layer and the remaining silicon nitride mask.

It will be appreciated that the trenching may be performed at another point in the process, either earlier or later, if desired.

Figure 4:
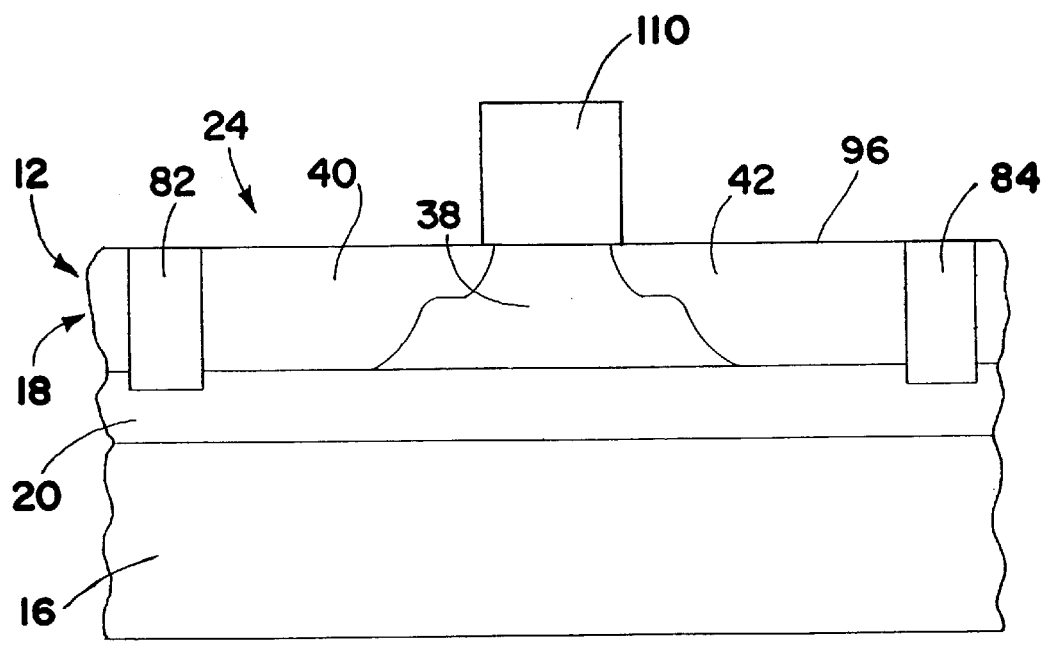

Portions of the silicon on opposing sides of the channel regions that are not masked by the dummy gate 110 then may be doped to produce the source 40 and the drain 42, as illustrated in FIG. 4. Doping is typically performed using well-known ion implantation techniques Ions of an N-type dopant, such as arsenic, are accelerated to a high velocity in an electric field and impinge on the target wafer. Because the ions cannot penetrate the dummy gate 110, the dummy gate effectively operates as a mask which results in doping only the exposed source region and drain region. Tilted implants may be used to form the source extension and the drain extension.

Figure 5:
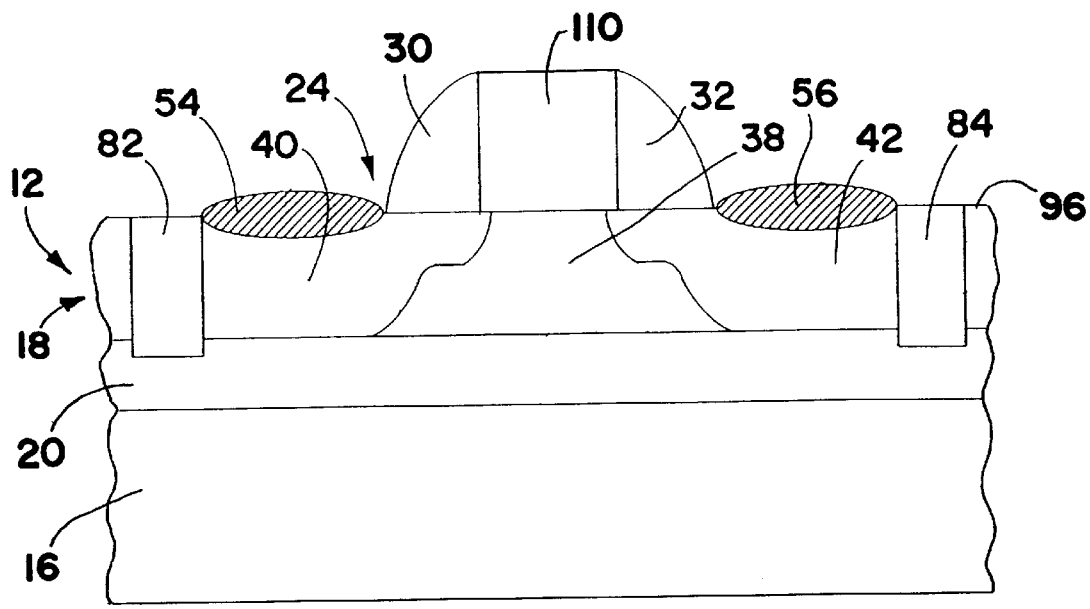

Referring now to FIG. 5, the silicide regions 54 and 56 are then formed. First the spacers 30 and 32 are formed, in order to prevent formation of suicide in parts of the semiconductor active region 24 which are next to the dummy gate 110 (which is where the gate 22 for the transistor 14 will later be formed). To form the spacers 30 and 32, a conformal dielectric layer (e.g., SiN) is deposited on the SOI wafer 12 and on the gate 110. Parts of the dielectric layer are then selectively removed to leave respective gate source-side and drain-side spacers 30 and 32. The deposit of the dielectric material and its selective removal may be accomplished by conventional means, for example chemical vapor deposition (CVD) such as LPCVD or plasma enhanced chemical vapor deposition (PECVD), of silicon dioxide, followed by anisotropic etching using suitable, well-known etchants, an exemplary etchant being $CHF_3$.

Silicidation may then be accomplished as follows. A layer of metal is deposited upon the dummy gate 110, the spacers 30 and 32, and the exposed portions of the surface semiconductor layer 18. The metal of the metal layer may be a metal such as titanium, cobalt, or nickel, which is suitable for forming a conducting compound, such as a silicide, with the semiconductor material. The metal layer may be deposited, for example, by sputtering.

Then a compound such as a silicide is formed between the metal of the metal layer and the exposed portions of the surface semiconductor layer 18. Suitable methods for formation of such electrically-conducting compounds (e.g., silicidation) are well known, an exemplary method being raising temperature of the semiconductor device 10 to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the semiconductor device 10 to a temperature between 600 and 900° C. for about 5 to 120 seconds. It will be appreciated that other temperatures and heating times may be employed. Finally, excess metal of the metal layer is removed by conventional, well-known means.

Figure 6:
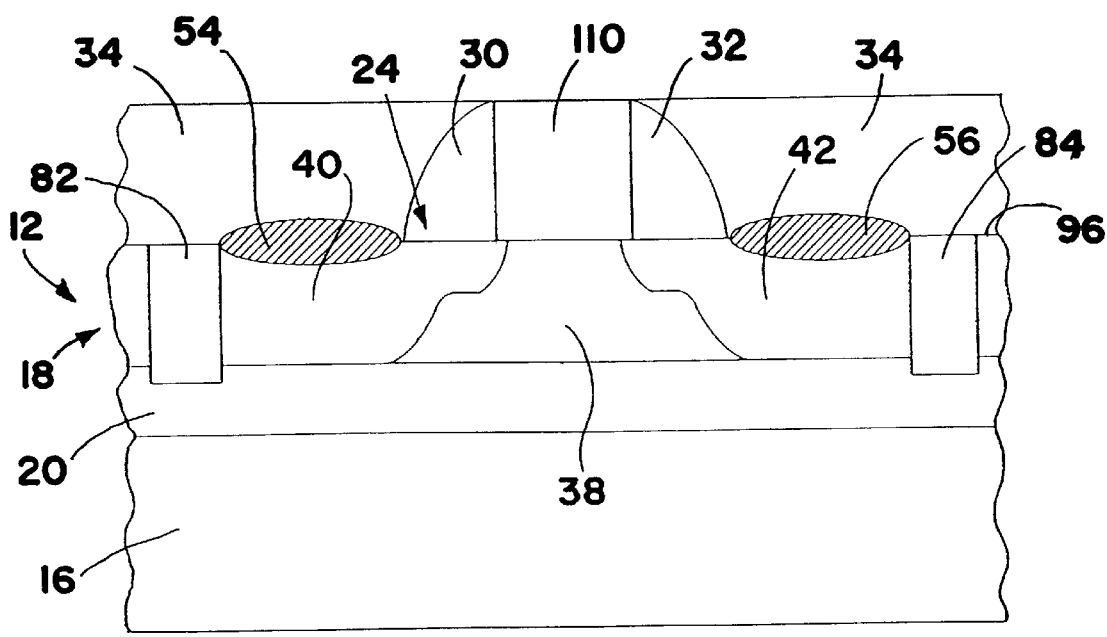

Thereafter, the planarization layer 34 is formed, as shown in FIG. 6. This may occur, for example, first by deposition of a layer of insulator material, for example $SiO_2$, by a process such as CVD. Then well-known chemical-mechanical polishing (CMP) may be employed to produce a planar surface 112, thereby exposing the top of the dummy gate 110.

Figure 7:
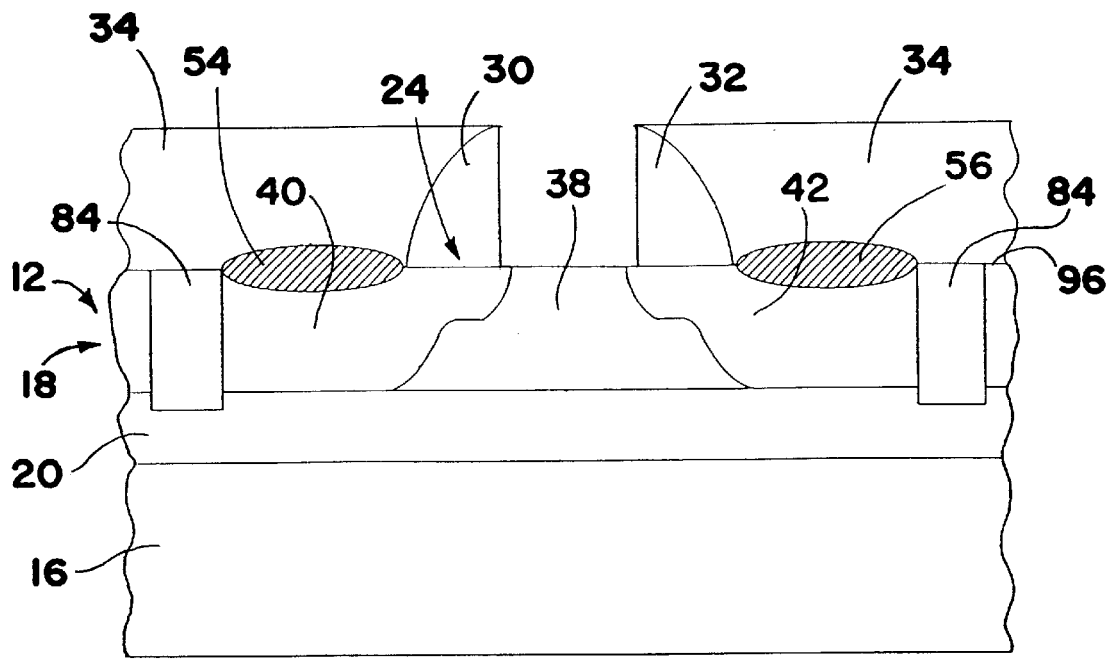
Figure 8:
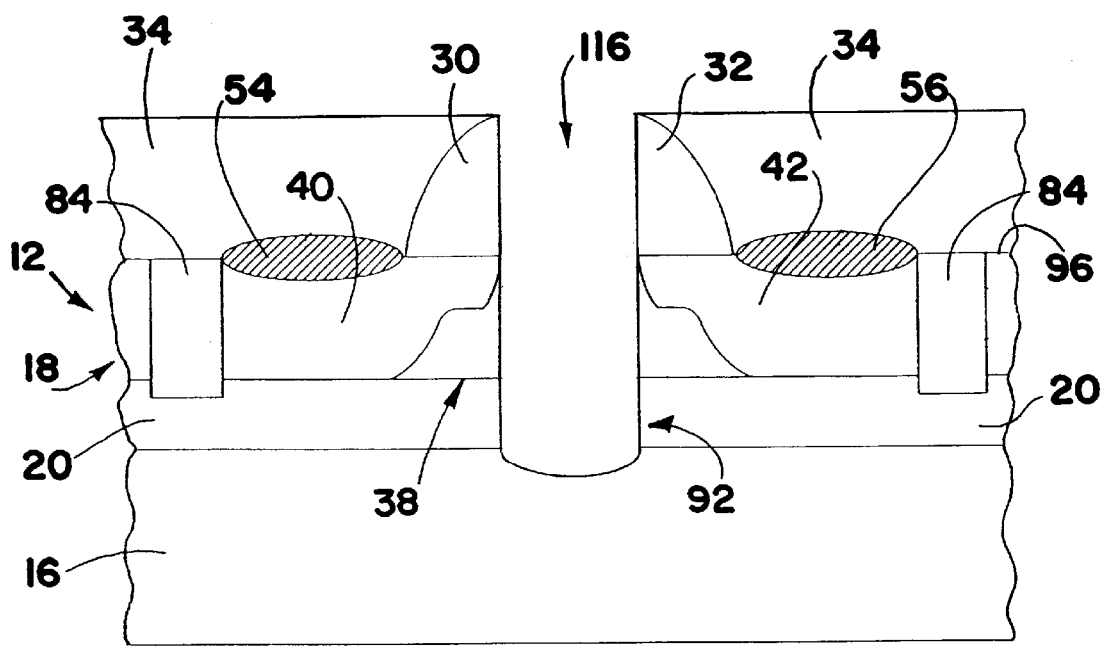

As shown in FIG. 7, the dummy gate 110 is then removed, for example by etching, allowing access to the underlying body 38. Then in FIG. 8, an opening or trench 116 is made by etching, the opening extending through the active region 24, and particulary through at least a portion of the body 38, and through the buried insulator layer 20, thereby creating the perforation 92 in the buried insulator layer. The etching used in removing the dummy gate 110 and creating the opening 116 may include one or more dry etch processes such as plasma etching, ion milling, reactive ion etching, reactive ion beam etching, and/or may include other processes suitable for carrying out the invention. It will be appreciated that other suitable etching processes may alternatively or in addition be employed.

It will be appreciated that the removal of the dummy gate 110 and the creation of the opening 116 may be parts of a single etching operation, or may performed in two or more separate operations. Also, if desired the opening may be extended into the semiconductor substrate 16.

It will be appreciated that the dummy gate is advantageously used both for forming the source 40 and the drain 42, and for positioning the opening 116. The opening 1 16 is thereby automatically accurately positioned within the active region 24 relative to the source 40 and the drain 42.

Figure 9:
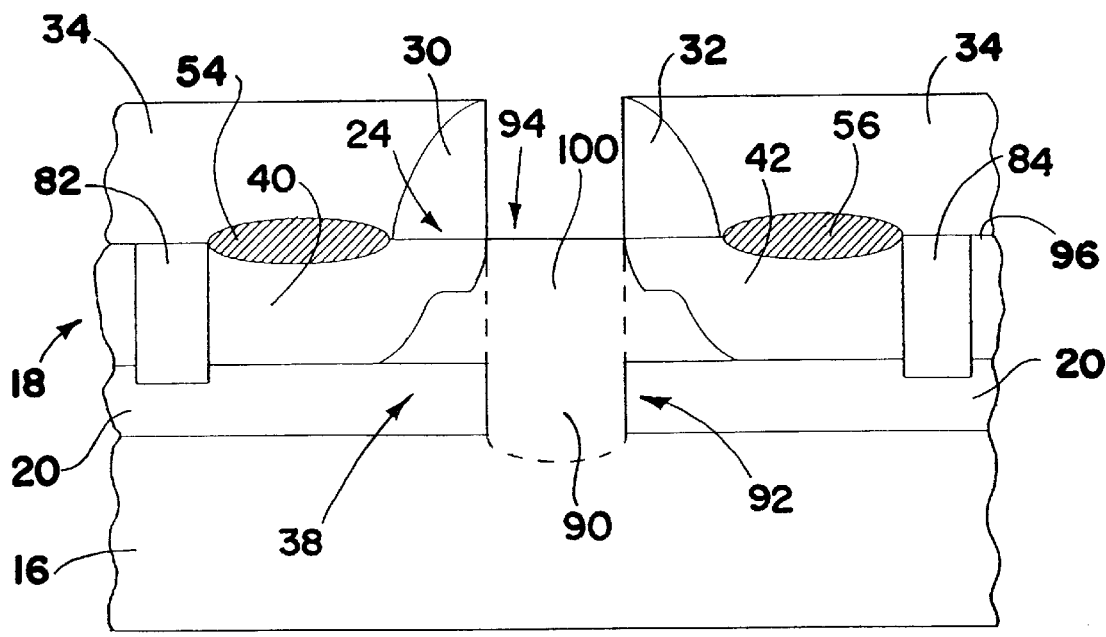

Moving on to FIG. 9, the opening 116 is filled with conductive material, such as the semiconductor fill material 94, for example by epitaxial growth of semiconductor material. Suitable epitaxial growth processes are well known in the art—further information regarding such processes may be found for example in Chapter 5 of S. Wolf and R. N. Tauber, Silicon Processing for the VLSI Era, Volume 1:

Processing Technology (1986), which is incorporated herein by reference. The central body portion 100 and the bridge 90 are thus created, electrically tying the body 38 to the semiconductor substrate 16.

Figure 10:
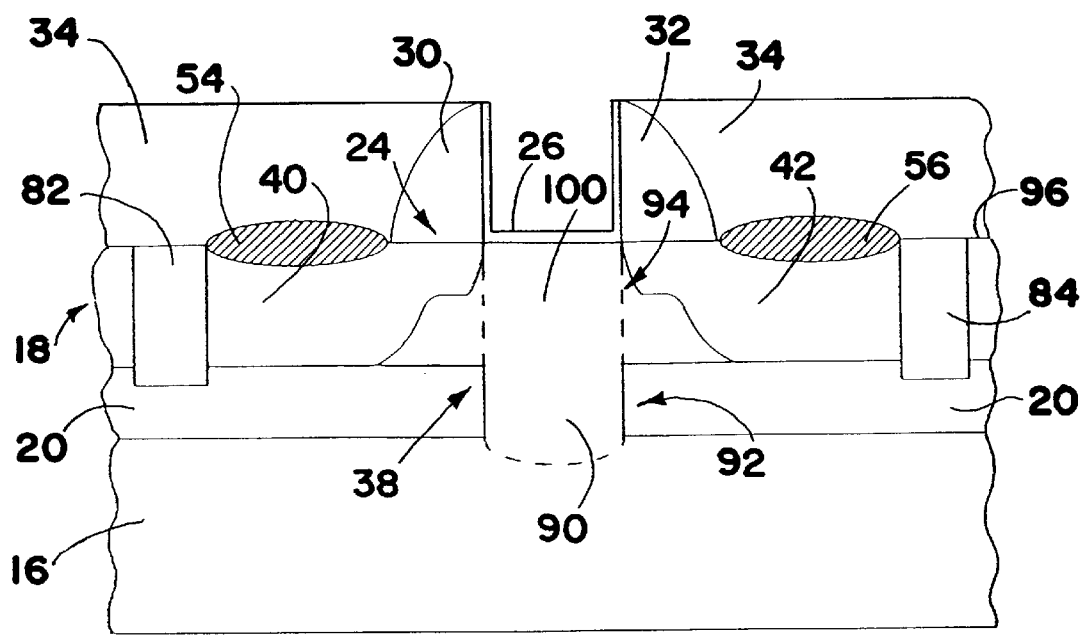

Then, as illustrated in FIG. 10, a gate dielectric layer 26 is formed by conventional means, such as deposition and etching. Finally, the gate electrode 28 is formed, completing the general structure of the transistor 14 and producing the semiconductor device shown in FIG. 1.

It will be appreciated that the above-described structure and method are only exemplary, and that many suitable variations may be employed. For example, the semiconductor material may be silicon or another suitable semiconductor material. It may be possible to substitute oxides for nitrides, and/or vice versa, in the above structure and/or in the above fabrication method.

The above-described method steps may be performed in a different order, with suitable modification. For example, the semiconductor bridge may be created by etch and epitaxial growth before the formation of the source and drain—in such a process a suitable mask may be employed for selective epitaxial growth, and a gate formed on the semiconductor fill material would be used as a mask in the formation of the source and the drain, and in formation of the silicide regions. It will be appreciated that other suitable modifications of the above-described method are possible.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a semiconductor device, comprising:

forming a dummy gate on an active region of a surface semiconductor layer which is separated from a semiconductor substrate by an intervening buried insulator layer;

selectively doping portions of the active region to form a source and a drain on opposite sides of a body, using the dummy gate as a doping mask;

removing the dummy gate;

exposing a portion of the semiconductor substrate by removing overlying portions of the active layer and of the buried insulator layer, thereby forming an opening perforating the surface semiconductor layer and the buried insulator layer, wherein the exposing includes etching the active region and the insulating layer through a space left by removal of the dummy gate; and epitaxially growing a semiconductor material to fill the opening and thereby electrically connect the substrate and the body.

2. The method of claim 1, wherein the semiconductor material includes doped semiconductor material, and wherein the epitaxially growing includes growing the doped semiconductor material.

3. The method of claim 1, wherein the expitaxially growing includes forming a semiconductor material bridge electrically connecting the substrate and the body; and wherein a cross-sectional area of the semiconductor material bridge is smaller than a cross-sectional area of the body.

4. The method of claim 3, wherein the source and the drain are electrically-isolated from the substrate by the buried insulator layer.

5. The method of claim 1, wherein the epitaxially growing includes forming a semiconductor material bridge electrically connecting the substrate and a central portion of the body.

6. The method of claim 1, wherein the epitaxially growing includes forming a semiconductor material bridge electrically connecting the substrate and an underside of the body.

\* \* \* \* \*

UNITED STATES PATENT AND TRADEMARK OFFICE
CERTIFICATE OF CORRECTION

PATENT NO. : 6,514,809 B1
DATED : February 4, 2003
INVENTOR(S) : Xiang

It is certified that error appears in the above-identified patent and that said Letters Patent is hereby corrected as shown below:

Column 2,
Line 13, replace "not-suffer" with -- not suffer --

Column 3,
Line 59, replace "semiconductors" with -- semiconductor, --

Column 5,
Line 58, replace "suicide" with -- silicide --

Signed and Sealed this

Twenty-fifth Day of March, 2003

JAMES E. ROGAN
*Director of the United States Patent and Trademark Office*